United States Patent
Hara et al.

(10) Patent No.: US 8,097,950 B2
(45) Date of Patent: Jan. 17, 2012

(54) SEMICONDUCTOR DEVICE AND ELECTRONIC COMPONENT MODULE USING THE SAME

(75) Inventors: Satoru Hara, Yokohama (JP); Shuzo Akejima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1075 days.

(21) Appl. No.: 11/620,799

(22) Filed: Jan. 8, 2007

(65) Prior Publication Data

US 2007/0159204 A1      Jul. 12, 2007

(30) Foreign Application Priority Data

Jan. 11, 2006   (JP) ................. P2006-003664

(51) Int. Cl.
*H01L 23/48*      (2006.01)
(52) U.S. Cl. ........................ 257/773; 257/786
(58) Field of Classification Search .......... 257/773, 257/786
See application file for complete search history.

(56) References Cited

U.S. PATENT DOCUMENTS

| | | | |
|---|---|---|---|
| 5,477,086 A * | 12/1995 | Rostoker et al. | 257/737 |
| 6,383,840 B1 * | 5/2002 | Hashimoto | 438/109 |
| 2001/0040288 A1 * | 11/2001 | Matsushima et al. | 257/704 |
| 2004/0222534 A1 | 11/2004 | Sawamoto et al. | |
| 2006/0040488 A1 * | 2/2006 | Fjelstad | 438/597 |
| 2007/0148819 A1 * | 6/2007 | Haba et al. | 438/107 |

FOREIGN PATENT DOCUMENTS

| | | |
|---|---|---|
| CN | 1519931 A | 8/2004 |
| JP | 2004-241713 | 8/2004 |
| JP | 2006-203005 | 8/2006 |
| WO | WO 01/08222 A1 | 2/2001 |

* cited by examiner

*Primary Examiner* — N Drew Richards
*Assistant Examiner* — Jae Lee
(74) *Attorney, Agent, or Firm* — Oblon, Spivak, McClelland, Maier & Neustadt, L.L.P.

(57) ABSTRACT

A semiconductor device includes a circuit board having an element mounting area, connecting pads positioned in the same surface side as the element mounting area and external connectors to be connected with the connecting pads, respectively; and a semiconductor element mounted on the element mounting area of the circuit board and having electrode pads to be electrically connected with the connecting pads, respectively. The external connectors are detachably configured through a combination of convex portions and concave portions which are mechanically and electrically connected with one another.

7 Claims, 5 Drawing Sheets

SEMICONDUCTOR DEVICE AND ELECTRONIC COMPONENT MODULE USING THE SAME

CROSS-REFERENCE TO RELATED APPLICATIONS

This application is based upon and claims the benefit of priority from the prior Japanese Patent Application No. 2006-003664 filed on Jan. 11, 2006; the entire contents which are incorporated herein by reference.

BACKGROUND

1. Field of the Invention

The present invention relates to a semiconductor device and an electronic component module using the semiconductor device.

2. Description of the Related Art

Conventionally, a semiconductor device is connected with a circuit board or the like by means of soldering. For example, a BGA package is generally utilized for a semiconductor device with high speed operationality and a large number of pins. The BGA package is configured such that a semiconductor device is mounted on one main surface of a circuit board and a plurality of solder balls functioning as external connectors are provided on the other main surface of the circuit board. The BGA package is soldered on another circuit board called as a mother board by melting the solder balls.

When the semiconductor device is connected through soldering, it is required that the solder is heated to a temperature higher than the melting point and thus, melted so that the semiconductor can be separated from the circuit board. In this point of view, it is difficult to repair the semiconductor device after the soldering. Moreover, the semiconductor is heated to a temperature higher than the melting point of the solder so as to be connected with the circuit board in advance. Therefore, since the semiconductor device is heated again at the higher temperature than the melting point of the solder at the separation, the repair of the semiconductor device may be inhibited if the thermal resistance of the semiconductor device is lower.

On the other hand, in order to realize the downsizing and/or the high density integration of the semiconductor device, such a multi-chip module (MCM) as accommodating and systematizing a plurality of semiconductor elements in one package is practically employed. As a typical MCM, such a packaging structure as mounting one or more memory elements and processor elements on one circuit board and sealing the thus obtained assembly as a whole may be exemplified. In view of the high density package of the MCM satisfying the requirement of the downsizing thereof and the development in function thereof, moreover, the commercial application of a packaging structure, POP (Package on Package) is being proceeded where a plurality of circuit boards with the corresponding mounted semiconductors are stacked three-dimensionally.

As a concrete structure of the POP, such a multistage structure as stacking a plurality of BGA packages is well known (refer to Patent Document No. 1). With the conventional POP, since the adjacent packages are connected with one another by means of soldering, it is required in the separation of the adjacent packages that the POP assembly is heated to a temperature higher than the melting point of the solder. In this point of view, it is difficult to repair the conventional POP and the repair of the conventional POP may be inhibited if the thermal resistance of the POP is lower.

[Patent Document No. 1] JP-A 2004-241713 (KOKAI)

SUMMARY

An aspect of the present invention relates to a semiconductor device comprises: a circuit board having an element mounting area, connecting pads positioned in the same surface side as the element mounting area and external connectors to be connected with the connecting pads, respectively; and a semiconductor element mounted on the element mounting area of the circuit board and having electrode pads to be electrically connected with the connecting pads, respectively, wherein the external connectors are detachably configured through a combination of convex portions and concave portions which are mechanically and electrically connected with one another.

Another aspect of the present invention relates to an electronic component module comprises: a first module component with at least one semiconductor device having a circuit board having an element mounting area, connecting pads positioned in the same surface side as the element mounting area and external connectors to be connected with the connecting pads, respectively; and a semiconductor element mounted on the element mounting area of the circuit board and having electrode pads to be electrically connected with the connecting pads, respectively, wherein external connectors are detachably configured through a combination of convex portions and concave portions which are mechanically and electrically connected with one another; and a second module component having connectors connectable for the external connectors of the first module component through the combination of convex portions and concave portions and at least one second electronic component of a semiconductor element and another electronic component except the semiconductor element.

DETAILED DESCRIPTION

Hereinafter, embodiments of the present invention will be described with reference to the drawings. The drawings, though referred to in describing the embodiments of the present invention, are provided only for an illustrative purpose and in no way limit the present invention.

Figure 1:
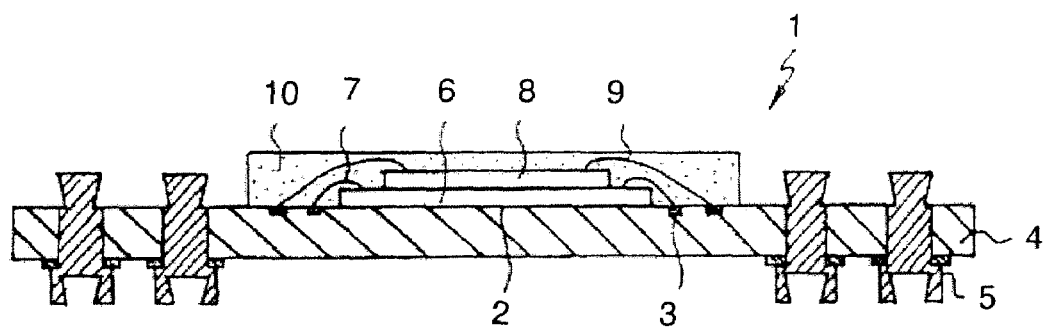
FIG. 1 is a cross-sectional view showing the structure of a semiconductor device according to an embodiment of the present invention.

FIG. 1 is a cross-sectional view showing the structure of a semiconductor device (semiconductor package) according to an embodiment of the present invention. The semiconductor device 1 illustrated in FIG. 1 includes a circuit board 4 as a packaging board where an element mounting area 2 and connecting pads 3 are defined on one main surface thereof. The circuit board 4 includes an insulating board such as a resin board, a ceramic board and a glass board and wires (not shown) provided in or on the insulating board. Concretely, as the circuit board 4 may be exemplified a multilayered printed-wiring board made of glass-epoxy resin or BT resin (bismaleimide triazine resin).

The element mounting area 2 is defined around the center of the main surface of the circuit board 4 and the connecting pads 3 are defined around the element mounting area 2. Then, external connectors 5 for mechanically and electrically connecting the circuit board 4 with another semiconductor device or circuit board are provided at the outer areas of the circuit board 4. The concrete structure of the external connector 5 will be described hereinafter. The connecting pads 3 function as bonding portions at wire bonding, and electrically connected with the external connectors 5 via a wiring network (including surface wirings and inner wirings).

A first semiconductor element 6 is adhered with the element mounting area 2 of the circuit board 4 with an insulating resin-based adhesive (e.g, dia attach material/not shown). The electrode pads (not shown) of the first semiconductor element 6 are connected with the connecting pads 3 via first bonding wires 7. Moreover, a second semiconductor element 8 is adhered with the first semiconductor element 6 with an insulating resin-based adhesive. The electrode pads (not shown) of the second semiconductor element 8 are connected with the connecting pads 3 via second bonding wires 9.

In this embodiment, although two semiconductor elements, i.e., the first semiconductor element 6 and the second semiconductor element 8 are mounted on the circuit board 4, the number of semiconductor elements is not limited to two, but any number. For example, only one semiconductor element may be mounted and also, three or more semiconductor elements may be mounted. Then, in the case that a plurality of semiconductor elements is mounted as in this embodiment, the plurality of semiconductor elements can be stacked one another on the circuit board, but may be arranged in plane on the circuit board. Then, the connection between the semiconductor elements and the circuit board may be conducted with another means such as flip chip bonding instead of the wire bonding.

A sealing resin 10 made of epoxy resin, etc. is formed on the circuit board 4 so as to cover the element mounting area 2 through molding. In other words, the semiconductor elements 6 and 8, which are mounted on the circuit board 4, are sealed with the bonding wires 7, 9 by the sealing resin 10, thereby constituting a semiconductor device 1. The sealing resin 10 is formed except the area for the external connectors 5 to be formed so that the terminal ends of the external connectors 5 can be exposed.

Then, the concrete structure of the external connector 5 will be described hereinafter, with reference to FIGS. 2-6. The external connector 5, to be provided on the circuit board 4, includes a convex portion and a concave portion and is configured such that the external connector 5 can be electrically, mechanically and detachably connected with another element via the convex portion and the concave portion. In other words, the external connectors 5 are configured so as to be electrically and mechanically connected with other connectors of a circuit board or a mounting board of another semiconductor element through the fitting of the convex portions and the concave portions thereof. Then, since the connection between the external connectors 5 and other connectors of another semiconductor is conducted through the fitting of the convex portions and the concave portions, the connection can be configured detachable.

Figure 2:
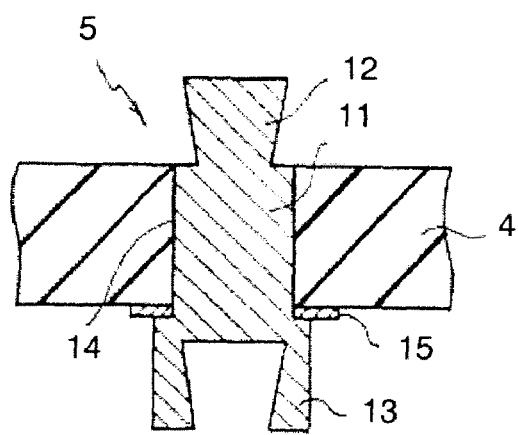
FIG. 2 is an enlarged cross sectional view of the structure of an external connector to be applied for the semiconductor device shown in FIG. 1.
Figure 3:
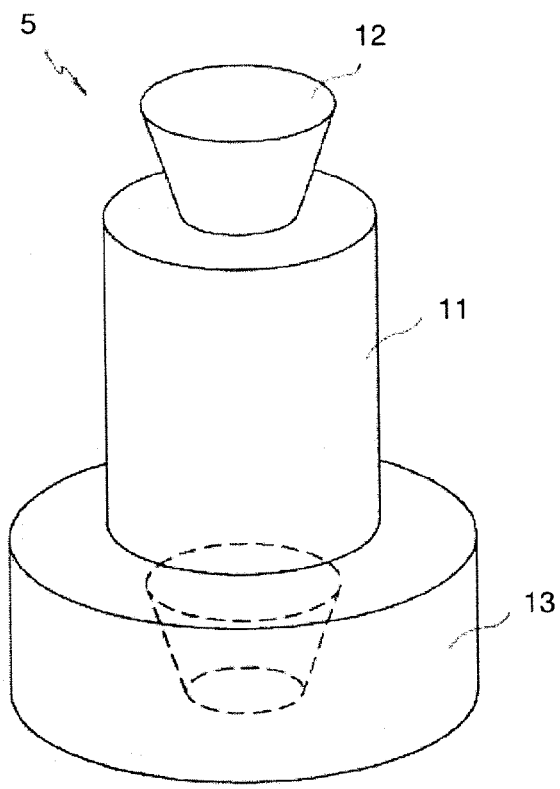
FIG. 3 is a perspective view showing the external connector shown in FIG. 2.

FIGS. 2 and 3 are an embodiment showing a concrete structure of the external connector 5. In this embodiment, the external connector 5 includes a body 11, a cylindrical convex connector 12 and a cylindrical concave connector 13. The convex connector 12 is provided at one end of the body 11, and the concave connector 13 is provided at the other end of the body 11. The convex connector 12 functions as a convex connecting mechanism and the concave connector 13 functions as a concave connecting mechanism. If the structural body comprised of the body 11, the convex portion 12 and the concave portion 13 is made integrally of a conductive material, the structural body can be employed as the external connector 5. Herein, with the external connector 5 to be provided at the semiconductor device 1, either of the convex connector 12 and the concave connector 13 is required, and both of the connectors are not essentially required.

In this embodiment, the external connectors 5 are inserted in through holes 14 formed at the circuit board 4. The through holes 14 are formed so as to penetrate the corresponding rounds 15 which are electrically connected with the wiring network provided at the circuit board 4. In this embodiment, since the external connectors 5 are inserted into the corresponding through holes 14 so that at least a portion of each connector 5 is contacted with the corresponding round 15, the external connectors 5 can be attached to the circuit board 4 under the condition that the external connectors 5 can be electrically connected with the connecting pads 3 via the rounds 15 and the wiring network. In this embodiment, the rounds 15 are provided on the rear surface of the circuit board 4, but may be provided on the main surface of the circuit board 4.

Figure 4:
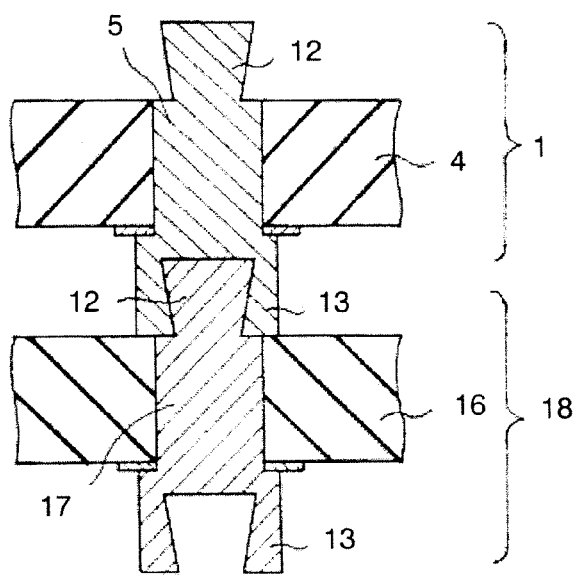
FIG. 4 is a cross sectional view showing the state where two external connectors as shown in FIG. 2 are connected with one another.

As shown in FIG. 4, each of the external connectors 5 of the semiconductor device 1 is detachably connected with each of other connectors 17 (which are formed as the connectors 5) provided at the board of another semiconductor device or mounting board. In this embodiment, the semiconductor device 1 is connected with another device 18 via the concave connectors 13 of the external connectors 5. In contrast, the device 18 is connected with the semiconductor device 1 via the convex portions of the connectors 17. In this way, the concave connectors 13 of the semiconductor device 1 are electrically and mechanically connected with the convex connectors 12 of the device 18 through the fitting thereof.

As described above, the external connectors 5 of the semiconductor device 1 can be electrically and mechanically connected with the connectors 17 (similar in structure to the connectors 5) of the device 18 by fitting the concave connectors 13 of the connectors 5 to the convex connectors 12 of the connectors 17. Since the external connectors 5 of the semiconductor element 1 are connected with the connectors 17 of the device 18 through the fitting between the convex portions and the concave portions of the connectors 5, 17, the connection between the semiconductor device 1 and the device 18, i.e., the connecting structure (assembly) can be simplified so that the semiconductor device 1 can be easily separated from the device 18 in repair.

In FIG. 4, the semiconductor device 1 is connected only with the device 18, but may be connected with an additional device via the convex connectors 12 of the external connectors 5. Moreover, since the device 18 includes the corresponding concave connectors 13 in the opposite side to the semiconductor device 1, the semiconductor device 1 can be connected with an additional device via the concave connectors 13 of the device 18. As shown in FIG. 4, in the case that the semiconductor device 1 is connected only with the device 18, the external connectors 5 are required to include the concave connectors 13, not the convex connectors 12. If the device 18 is connected via the concave connectors 13, the external connectors 5 are required to include the convex connectors 12, not the concave connectors 13.

The concave connectors 13 of the semiconductor device 1 can be easily separated from the convex connectors 12 of the device 18 by means of elastic deformation in metallic material. In this case, the inner sizes of the concave connectors 13 may be set smaller than the corresponding outer sizes of the convex connectors 12, and the connectors 5, 17 may be made of elastically metallic material so that the concave connectors 13 can be easily connected with the convex connectors 12 properly, and separated therefrom by means of the elastic deformation of the connectors 13, 12. As described above, the concave connectors 13 of the semiconductor device 1 can be switched for the convex connectors 12 thereof when the device 18 is connected via the concave connectors 13. In this case, too, the convex connectors 12 of the semiconductor device 1 can be easily separated from the concave connectors 13 of the device 18 by means of elastic deformation in metallic material.

In this way, the external connectors 5 of the semiconductor device 1 can be easily connected with and separated from the connectors 17 of the device 18 through the connection and separation between the concave connectors 13 and the convex connectors 12 so that the semiconductor device 1 can be easily and simply connected with and separated from the device 18 such as another semiconductor element or mounting board. In the case that the concave connectors 13 are separated from the convex connectors 12 by means of the elastic deformation in metallic material, the connectors 5, 17 may be preferably made of spring steel, phosphor copper (Cu—Sn based alloy), new silver (Cu—Ni based alloy) or beryllium copper (Cu—Be based alloy). In this case, the connection and separation between the connectors can be maintained for a long time.

Figure 5:
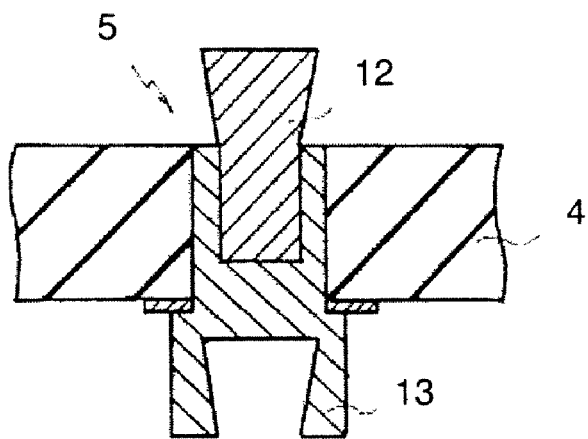
FIG. 5 is an enlarged cross sectional view of the structure of another external connector to be applied for the semiconductor device shown in FIG. 1.
Figure 6:
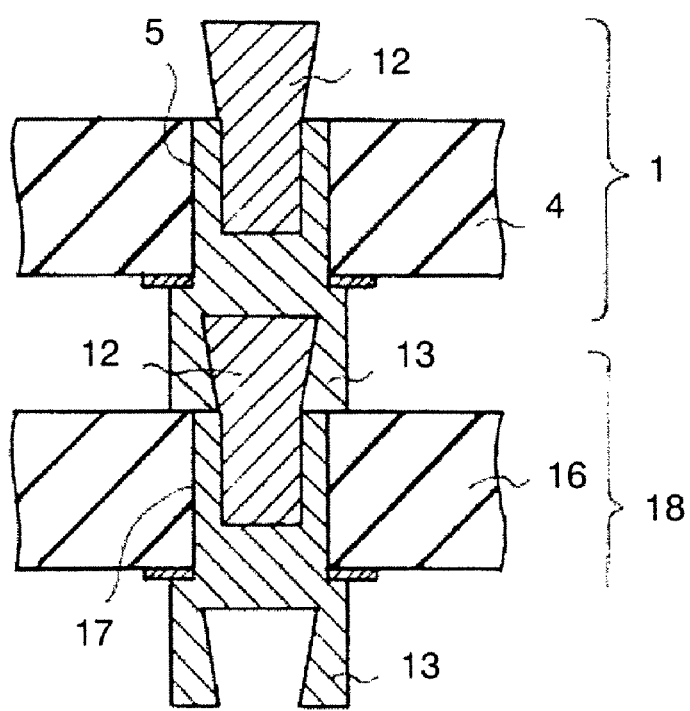
FIG. 6 is a cross sectional view showing the state where two external connectors as shown in FIG. 5 are connected with one another.

The concave connectors 13 of the semiconductor device 1 may be connected with and separated from the convex connectors 12 of the device 18 by means of the difference in thermal expansion of metallic material, instead of the elastic deformation. As shown in FIGS. 5 and 6, for example, the concave connectors 13 and the convex connectors 12 of the external connectors 5 are made of their respective different metallic materials one another. Concretely, the thermal expansion coefficient of the metallic material of the concave connectors 13 is set larger than the thermal expansion coefficient of the metallic material of the convex connectors 12. Supposed that the thermal expansion coefficient of the metallic material of the convex connectors 12 is defined as $\alpha 1$ and the thermal expansion coefficient of the metallic material of the concave connectors 13 is defined as $\alpha 2$, the relation of $\alpha 2 > \alpha 1$ is satisfied.

In this case, the convex connectors 12 and the concave connectors 13 are heated so that the significant difference in size between the connectors 12 and 13 (i.e., the differences between the inner sizes of the connectors 13 and the corresponding outer sizes of the connectors 12) can be formed when the concave connectors 13 of the semiconductor device 1 are connected with the convex connectors 12 of the device 18. Since the thermal expansion coefficients of the concave connectors 13 are set relatively larger than the thermal expansion coefficients of the convex connectors 12, the inner sizes of the concave connectors 13 becomes larger than the corresponding outer sizes of the convex connectors 12 when the connectors 12, 13 are heated at the connection thereof. Therefore, the concave connectors 13 can be easily connected with the convex connectors 12. When the connectors 12, 13 are cooled after the connection, the connection between the connectors 12 and 13 can be tightened.

Similarly, the concave connectors 13 can be easily drawn out of the corresponding connectors 12 by utilizing the difference in size between the connectors 12 and 13 at heating, originated from the difference in thermal expansion between the connectors 12 and 13. As described above, the concave connectors 13 of the semiconductor device 1 can be switched for the convex connectors 12 thereof when the device 18 is connected via the concave connectors 13. In this case, too, the convex connectors 12 of the semiconductor device 1 can be easily drawn out from the concave connectors 13 of the device 18 by means of difference in thermal expansion between the connectors 12 and 13. In this way, the external connectors 5 of the semiconductor device 1 can be easily connected with and separated from the connectors 17 of the device 18 through the connection and separation originated from the difference in thermal expansion between the concave connectors 13 and the convex connectors 12 so that the semiconductor device 1 can be easily and simply connected with and separated from the device 18 such as another semiconductor element or mounting board. In the case that the concave connectors 13 are separated from the convex connectors 12 by means of the difference in thermal expansion, the connectors 12, 13 may be preferably made of the combination of Cu-based material and Al-based material, the combination of Fe-based material and Cu-based material or the combination of Fe-based material and Al based material.

If the concave connectors 13 are made of an Al-based material (alloy) with a thermal expansion coefficient of about 23 ppm and the convex connectors 12 are made of a Cu-based material (alloy) with a thermal expansion coefficient of about 17 ppm, the connection and separation between the concave connectors 13 and the convex connectors 12 can be easily and properly performed when the connectors 12 and 13 are heated under the condition that the semiconductor elements 6, 8 can not be thermally damaged. If the concave connectors 13 are made of an Cu-based material (alloy) with a thermal expansion coefficient of about 17 ppm and the convex connectors 12 are made of a Fe-based material (alloy) with a thermal expansion coefficient of about 12 ppm, the connection and separation between the concave connectors 13 and the convex connectors 12 can be also easily and properly performed. Then, if the concave connectors 13 are made of an Al-based material (alloy) with a thermal expansion coefficient of about 23 ppm and the convex connectors 12 are made of a Fe-based material (alloy) with a thermal expansion coefficient of about 12 ppm, the connection and separation between the concave connectors 13 and the convex connectors 12 can be easily and properly performed.

According to the semiconductor device 1 in this embodiment, the external connectors 5 can be easily and simply connected with the connectors of the device 1 such as another semiconductor device or mounting board. Therefore, the connecting function (e.g., module-forming function) and separating function between the semiconductor device 1 and the device 18 can be enhanced simultaneously. With the use of the semiconductor device 1, the mounting function of the semiconductor device 1 for the circuit board can be enhanced, and a POP (Package on package) structured semiconductor module and an electronic component module integrated with another electronic component can be easily realized.

Figure 7:
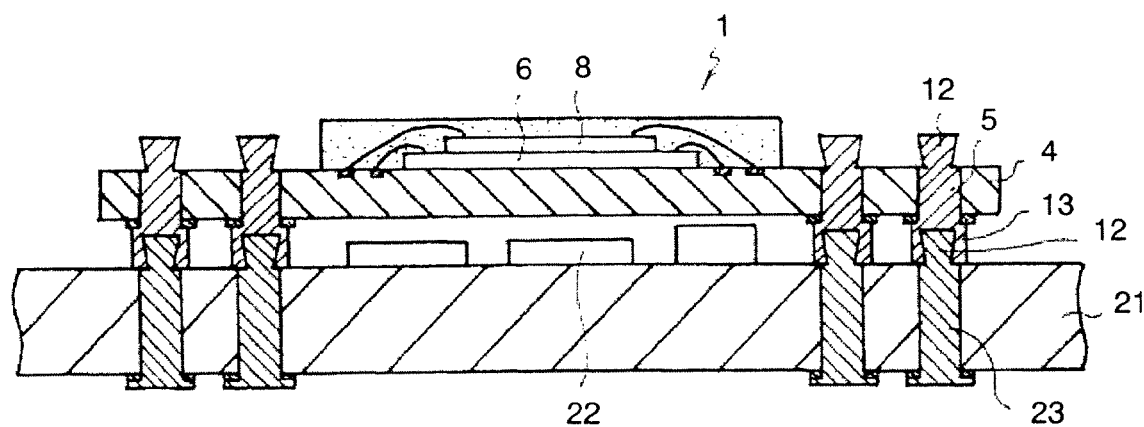
FIG. 7 is a cross sectional view showing the state where the semiconductor device shown in FIG. 1 is mounted on a circuit board.

FIG. 7 is a cross sectional view showing the state where the semiconductor device 1 is mounted on a mounting board 21. On the mounting board 21 are mounted electronic components 22 such as condensers and chip resistances and provided connectors 23 (similar in structure to the external connectors 5) connectable with the external connectors 5 of the semiconductor device 1. The semiconductor device 1 includes the external connectors 5 of which the concave connectors 13 are positioned in the side of the mounting board 21. Then, the mounting board 21 includes the connectors 23 of which the convex connectors 12 are provided connectable for the concave connectors 13 of the semiconductor device 1. The connectors 23 can also function as the through hole wirings of the circuit board constituting the mounting board 21.

In FIG. 7, the semiconductor device 1 is mounted on the mounting board 21. In the case of mounting the semiconductor device 1, the external connectors 5 of the semiconductor device 1 are positioned for the connectors 23 of the mounting board 21, and then, the concave connectors 13 are inserted and fitted into the convex connectors 12, as shown in FIGS. 2-4, by means of the elastic deformation in metallic material so that the external connectors 5 can be electrically and mechanically connected with the connectors 23. The concave connectors 13 may be inserted and fitted into the convex connectors 12, as shown in FIGS. 5-6, by means of the difference in thermal expansion of metallic material so that the external connectors 5 can be electrically and mechanically connected with the connectors 23.

In this way, the semiconductor device 1 can be easily and simply mounted on the mounting board 21 through the fitting between the concave connectors 13 and the convex connectors 12. In this case, the reliability of the electric connection between the connectors 5 and 23 after mounting can be enhanced as described above. In the repair of the semiconductor device 1, the semiconductor device 1 can be easily separated from the mounting board 21. Therefore, the connection and separation between the semiconductor device 1 and the mounting board 21 can be easily and simply performed.

Figure 8:
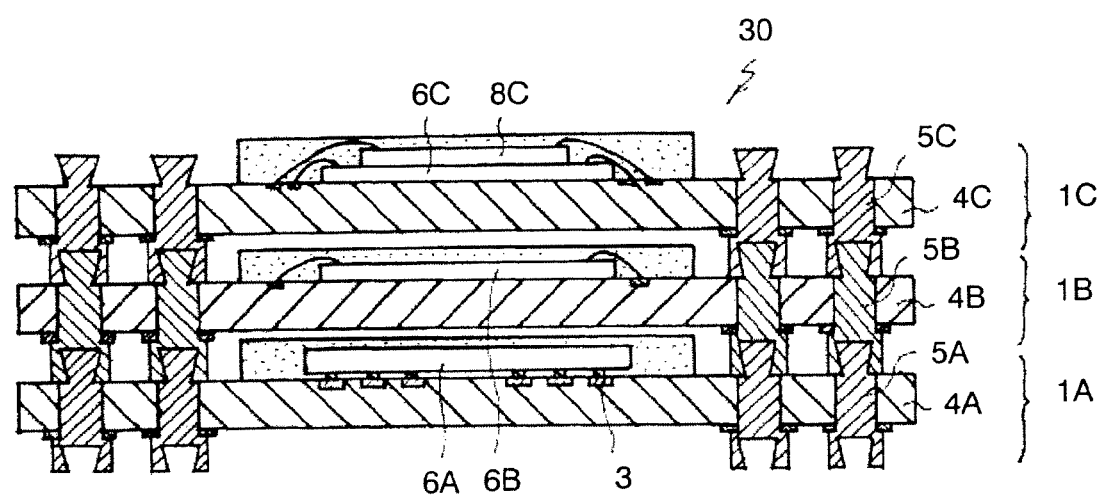
FIG. 8 is a cross-sectional view showing a semiconductor module as an electronic component module according to an embodiment of the present invention.

Then, an embodiment of an electronic component module will be described. FIG. 8 is a cross-sectional view showing a semiconductor module as an electronic component module according to an embodiment. In FIG. 8, the semiconductor module 30 is configured as a POP structured module such that a plurality of semiconductors 1 are stacked one another. Concretely, in FIG. 8, a first semiconductor device 1A with a logic element as a first semiconductor element 6A mounted thereon, a second semiconductor device 1B with a DRAM as a second semiconductor element 6B mounted thereon and a third semiconductor device 1C with a NAND type flash memory and a controller as a third semiconductor element 6C and a fourth semiconductor element 8C, respectively, mounted thereon are subsequently stacked.

In the first semiconductor device 1A, the semiconductor element 6A is flip-chip bonded to the circuit board 4A. In the second semiconductor device 1B and 1C, the semiconductor elements 6B, 6C and 8C are wire bonded to the circuit boards 4B and 4C, respectively, as in the above-described embodiment. Herein, the semiconductor elements 6A, 6B, 6C and 8C are exemplified, and not limited to the exemplified structures. The semiconductor elements 6A, 6B, 6C and 8C correspond to the electronic components of the electronic component module, and the semiconductor devices 1A, 1B and 1C corresponds to the module components of the electronic component module.

The first semiconductor device 1A is electrically and mechanically connected with the second semiconductor device 1B by fitting the convex connectors 12 of the external connectors 5A into the concave connectors 13 of the external connectors 5B. The second semiconductor device 1B is electrically and mechanically connected with the third semiconductor device 1C by fitting the convex connectors 12 of the external connectors 5B into the concave connectors 13 of the external connectors 5C. The fitting between the concave connectors 13 and the convex connectors 12 can be performed by means of the elastic deformation in metallic material or the difference in thermal expansion of metallic material. In this embodiment, the three semiconductor devices 1A, 1B and 1C are stacked subsequently so as to constitute the POP structured module. However, the stacking number of semiconductor device is not limited to three, but may be set to two, four or more.

As described above, the POP structured semiconductor module 30 can be easily fabricated by fitting the convex connectors 12 into the corresponding concave connectors 13. In this case, the number of fabricating steps in the POP structured semiconductor module 30 can be reduced remarkably, and the connection between various semiconductor devices can be easily realized. Moreover, in the repair of one or more of the semiconductor devices 1, the corresponding semiconductor device(s) to be repaired can be easily separated so that the semiconductor module 30 can be easily repaired by removing the disadvantages in a conventional POP structured module of the repairing difficulty and repairing restriction.

Figure 9:
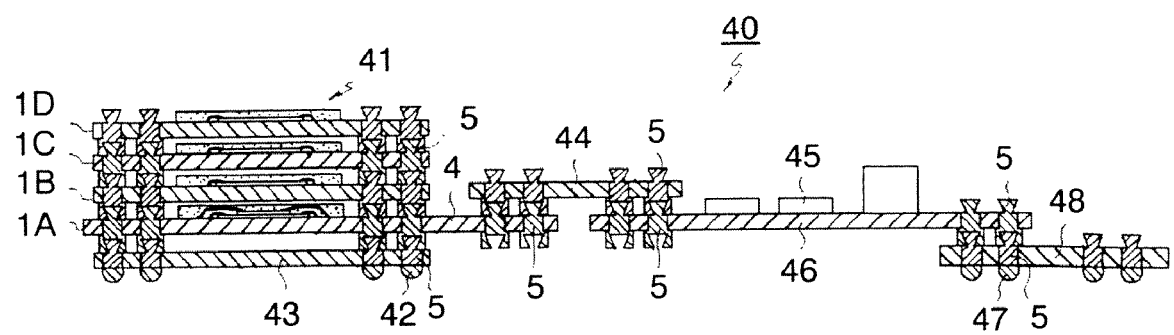
FIG. 9 is a cross sectional view showing an electronic component module according to another embodiment of the present invention.

FIG. 9 is a cross sectional view showing an electronic component module according to another embodiment. The electronic component module 40 in FIG. 9 is extended from a POP structured semiconductor module 41 similar to the one in FIG. 8, and configured such that the semiconductor module 41 is connected with other module components with electronic components except semiconductor elements. Concretely, the electronic module 40 includes, as a first module component, the semiconductor module 41 with the first through fourth semiconductor devices 1A through 1D which are connected with one another via the external connectors 5.

A circuit board 43 with solder balls 42 is provided under the first semiconductor device 1A which is located at the bottom position of the semiconductor module 41. The circuit board 43 with the solder balls 42 is connected with the first semiconductor device 1A via the external connectors 5. The first semiconductor device 1A is also connected to a circuit board 46 on which electronic components 45 such as condensers and chip resistances via a connecting board 44. The circuit board 46 with the electronic components 46 constitutes a second module component of the electronic component module 40, and a circuit board 48 with solder balls 47 is provided under the circuit board 46.

The circuit board 4 of the first semiconductor device 1A, the connecting board 44, the circuit board 46 with the mounted electronic components 45 and the circuit board 48 with the solder balls 47 are connected with one another via the external connectors 5, respectively. In this way, the semiconductor module 41 can be easily connected with the electronic module 46 not constituting a semiconductor module with the external connectors 5 having the convex connectors 12 and the concave connectors 13 so that the intended electronic module 40 can be easily fabricated and the module components of the module 40 can be easily separated.

Figure 10:
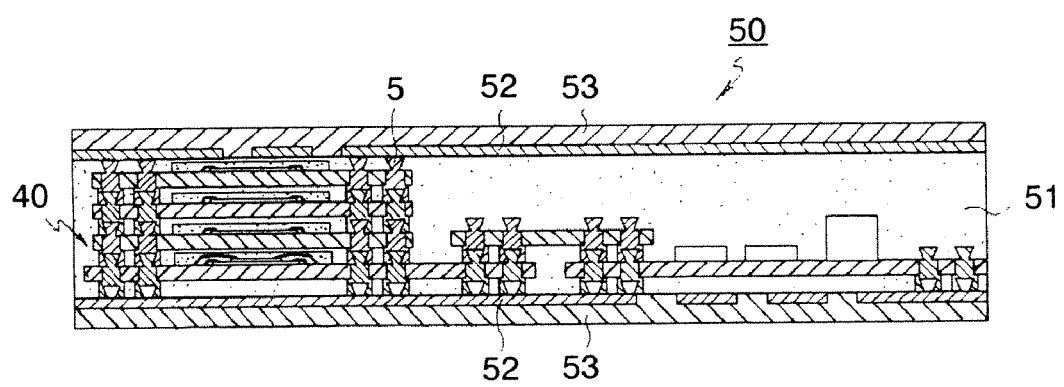
FIG. 10 is a cross sectional view showing an electronic component module according to still another embodiment of the present invention.

FIG. 10 is a cross sectional view showing an electronic component module according to still another embodiment. In this embodiment, such an element built-in board 50 as employing the electronic component module 40 shown in FIG. 9 as an element structured body is exhibited. The electronic component module 40 is sandwiched by insulating resin sheets 53 with wiring layers 52 made of copper foil via an insulating resin layer 51. The thus obtained assembly is thermally pressed, thereby constituting the element built-in board 50. In this case, the external connectors 5 function as through hole wirings of the element built-in board 50, and some of the connectors 5 are connected to the wiring layers 52. In this embodiment, since the electronic component module 40 is employed as the element structured body, the productivity of the element built-in board 50 can be enhanced.

The present invention is not limited to the above-described embodiments, but may be applied to various semiconductor devices with external connectors utilizing the connection of the combination of convex connectors and concave connectors or various electronic component module utilizing the semiconductor devices as described above. Then, the present invention encompasses the semiconductor devices and the electronic component modules. Moreover, every kind of variation and modification may be made without departing from the scope of the present invention.

What is claimed is:

1. A semiconductor device, comprising:
    a circuit board having an element mounting area, connecting pads positioned in the same surface side as said element mounting area and external connectors to be connected with the said connecting pads, respectively; and
    a semiconductor element mounted on said element mounting area of said circuit board and having electrode pads to be electrically connected with said connecting pads, respectively,
    wherein said external connectors are detachably configured through a combination of convex portions and concave portions which are mechanically and electrically connected with one another, and
    each of said external connectors is embedded into said circuit board and includes at least one of a convex connector corresponding to said convex portion and a concave connector corresponding to said concave portion, the convex connector having a first inverted truncated cone form having a first circular top, a first circular bottom, and a circular body which tapers, a diameter of the first circular top being larger than that of the first circular bottom, and the concave connector having a second inverted truncated cone form having a second circular top, a second circular bottom, and a circular inner side which tapers, a diameter of the second circular top being larger than that of the second circular bottom, corresponding to the first inverted truncated cone form.

2. The semiconductor device as set forth in claim 1, wherein said semiconductor element is a plurality of semiconductor elements which are stacked subsequently.

3. The semiconductor device as set forth in claim 1, wherein said semiconductor element is a plurality of semiconductor elements which are arranged in plane.

4. The semiconductor device as set forth in claim 1, wherein a diameter of the first circular top is larger than a diameter of the second circular bottom so that said convex connector can be electrically and mechanically connected with said concave connector by means of elastic deformation of said convex connector and said concave connector.

5. The semiconductor device as set forth in claim 1, wherein a thermal expansion coefficient of said concave connector is set larger than a thermal expansion coefficient of said convex connector so that said convex connector can be electrically and mechanically connected with said concave connector by means of the difference in thermal expansion between said convex connector and said concave connector.

6. The semiconductor device as set forth in claim 5, wherein when said thermal expansion coefficient of said convex connector is defined as $\alpha 1$ and said thermal expansion coefficient of said concave is defined as $\alpha 2$, a relation of $\alpha 2 > \alpha 1$ is satisfied.

7. The semiconductor device as set forth in claim 1, wherein the larger the distance from said circuit board to a first point on an axis of the convex portion is, the larger a diameter of the convex portion at the first point is, and
    the larger the distance from said circuit board to a second point on an axis of the concave portion is, the larger a diameter of the concave portion at the second point is.

* * * * *